United States Patent
Chi et al.

(10) Patent No.: US 9,406,525 B2
(45) Date of Patent: Aug. 2, 2016

(54) METHOD FOR SEMICONDUCTOR MANUFACTURING

(71) Applicant: TAIWAN SEMICONDUCTOR MANUFACTURING COMPANY LTD., Hsinchu (TW)

(72) Inventors: Pei-Wen Chi, Taichung (TW); Hsueh-Chin Lu, Taichung (TW); Shin Hsien Liao, Chiayi County (TW); Hung-Hsin Liang, Taichung (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 105 days.

(21) Appl. No.: 14/081,630

(22) Filed: Nov. 15, 2013

(65) Prior Publication Data

US 2015/0140829 A1    May 21, 2015

(51) Int. Cl.
*H01L 21/033*    (2006.01)
*H01L 21/311*    (2006.01)
*H01L 21/67*    (2006.01)

(52) U.S. Cl.
CPC ....... *H01L 21/31133* (2013.01); *H01L 21/6708* (2013.01)

(58) Field of Classification Search
USPC ........... 438/725, 748; 216/83, 88, 90; 134/19, 134/34
See application file for complete search history.

(56) References Cited

U.S. PATENT DOCUMENTS

| | | | | |
|---|---|---|---|---|
| 5,362,682 A | * | 11/1994 | Bozler et al. | 438/458 |
| 5,931,721 A | * | 8/1999 | Rose et al. | 451/89 |
| 5,989,354 A | * | 11/1999 | Dormer et al. | 134/2 |
| 6,204,081 B1 | * | 3/2001 | Kim et al. | 438/30 |
| 6,273,790 B1 | * | 8/2001 | Neese et al. | 451/38 |
| 2005/0139487 A1 | * | 6/2005 | Zwicker et al. | 205/701 |
| 2006/0046482 A1 | * | 3/2006 | Verhaverbeke | 438/689 |
| 2007/0089761 A1 | * | 4/2007 | Banerjee et al. | 134/34 |
| 2011/0247661 A1 | * | 10/2011 | Hayashida | H01L 21/67051 134/34 |
| 2014/0137892 A1 | * | 5/2014 | Brown et al. | 134/18 |

* cited by examiner

*Primary Examiner* — Shamim Ahmed
(74) *Attorney, Agent, or Firm* — WPAT, P.C., Intellectual Property Attorneys; Anthony King

(57) ABSTRACT

A method includes followings operations. A semiconductor substrate is provided. A photoresist is formed on the semiconductor substrate. Dopants are inserted into the photoresist to carbonize a portion of the photoresist. An etch steam is sprayed on the semiconductor substrate and the photoresist. A hole is formed at a surface of the photoresist by the etch steam. The etch steam is flowed into the hole so as to remove a portion of the photoresist at an interface between the semiconductor substrate and the photoresist. The photoresist is decorticated from the semiconductor substrate.

20 Claims, 15 Drawing Sheets

400

- 401 — Forming a sulfuric mist
- 402 — Transferring the sulfuric mist into the spray bar
- 403 — Distributing the sulfuric mist around a carbonized photoresist
- 404 — Forming a crack at a surface of the photoresist by the sulfuric mist
- 405 — Separating the photoresist from the semiconductor substrate by the crack

METHOD FOR SEMICONDUCTOR MANUFACTURING

FIELD

The disclosure relates to a method for manufacturing a semiconductor.

BACKGROUND

More than one million micro-electronic field effect transistors (e.g., complementary metal-oxide-semiconductor (CMOS) field effect transistors) are fabricated on a substrate (e.g., semiconductor wafer) to form an integrated circuit. During the fabrication process of the integrated circuit, a photoresist is deposited, exposed, and developed to create a mask utilized to etch the underlying layers.

To produce the integrated circuit, implanting ions into various portions of the integrated circuit is necessary. During ion implantation, wafers are bombarded by a beam of electrically charged ions, called dopants. Implantation changes the properties of the material where the dopants are implanted in order to achieve a particular electrical performance. These dopants are accelerated to an energy that will permit them to penetrate (i.e., implant) the film to a desired depth. During implantation, high-dose or high-energy ions may implant in the photoresist layer and cause a hard, crust-like layer to form on the surface of the photoresist layer. The crust layer is difficult to remove using conventional stripping processes. Moreover, if the crust layer or underlying photoresist is not removed, the residual photoresist becomes a contaminant during subsequent processes. Thus, an improved method for stripping a photoresist is still in great demand.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

A more complete understanding of the present disclosure may be derived by referring to the detailed description and claims when considered in connection with the Figures, where like reference numbers refer to similar elements throughout the Figures, and:

FIG. 10 is a flowchart of a method for separating the photoresist from the semiconductor substrate according to some embodiments of the present disclosure;

DETAILED DESCRIPTION OF THE INVENTION

Figure 1:
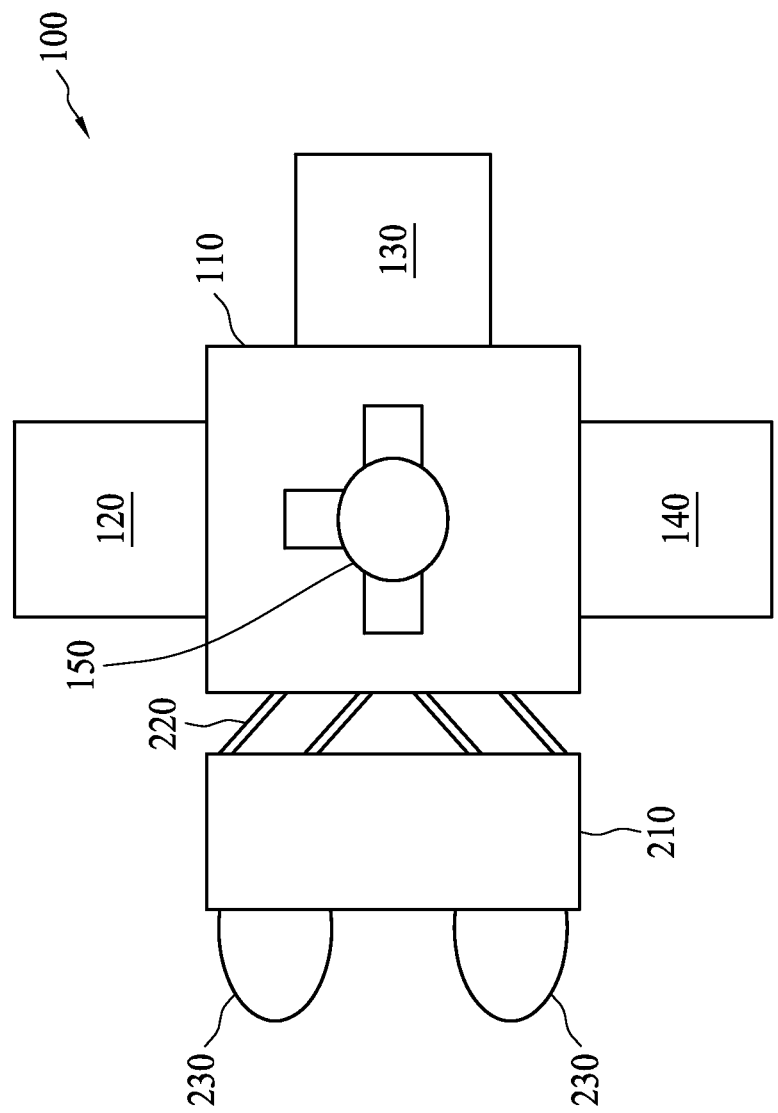
FIG. 1 is a top view of a system according to some embodiments of the present disclosure.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

In the present disclosure, a method for stripping a photoresist with a crust thereon from the semiconductor substrate is provided by using a stream of very small drops of liquid floating in the air. These small drops form a crack, a seam, an opening, or a hole at a bottom surface of the photoresist where it is less likely bombarded by implanting ions. The crack separates the photoresist having the crust thereon from the semiconductor substrate. Thus, the crust-like photoresist is stripped from the semiconductor substrate so as to avoid a contamination occurring at subsequent processes.

In various embodiments, these small drops perform the stripping function in the form of an etch steam, a sulfuric mist, or a high temperature molecule according to various designs. In some embodiments, the small drops form a steam with a sulfuric mixture, which etches a portion of the photoresist close to the interface between the photoresist and the semiconductor substrate such that several cracks or seams are formed around the interface. During the stripping process, a centrifugal force resulting from the spinning of the semiconductor substrate enlarges the cracks. After those cracks connect, the photoresist having the crust thereon is easily peeled from the semiconductor substrate so as to prevent the semiconductor substrate in the next run from the contaminant due to a crust-like photoresist.

In describing and claiming the present disclosure, the following terminology will be used in accordance with the definitions set forth below.

As used herein, a "substrate" refers to a bulk substrate on which various layers and device structure are formed. In some embodiments, the bulk substrate includes silicon or a compound semiconductor, such as Ga As, InP, Si/Ge, or SiC. Examples of the layers include dielectric layers, doped layers, polysilicon layers, or conductive layers. Examples of the device structures include transistors, resistors, and/or capacitors, which are interconnected through an interconnect layer to additional integrated circuits. In some embodiments, the bulk substrate includes a wafer such as a polished wafer, an epi wafer, an argon anneal wafer, a hai wafer and a silicon on insulator (SOI) wafer.

As used herein, a "semiconductor substrate" refers to a chip carrier, which is generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation. Active electrical components, such as transistors, have the ability to control the flow of electrical current. Passive electrical components, such as capacitors, inductors, resistors, and transformers, create a relationship between voltage and current necessary to perform electrical circuit functions.

As used herein, "active and passive components" refers to components, which are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers are formed by a variety of deposition techniques determined in part by the type of material being deposited. For example, thin film deposition involves chemical vapor deposition (CVD), physical vapor deposition (PVD), electrolytic plating, and electroless plating processes. Each layer is generally patterned to form portions of active components, passive components, or electrical connections between components. The layers are patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

As used herein, "back-end manufacturing" refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual dies are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

As used herein, a "crust" or "crust layer" recited in the present disclosure is a layer formed on the photoresist when high dopant concentrations are implanted into the photoresist. The crust layer may form due to the photoresist losing hydrogen during the implantation. The loss of hydrogen from the surface of the photoresist layer promotes carbon bonding that creates a hard, graphite-like crust. In some embodiments, the stripped substrate is then annealed. By providing the implantation, stripping, and annealing within a single system, oxidation of the semiconductor substrate is avoided while providing a high substrate throughput. The substrate throughput is increased because a portion of the dopant remains in the implantation chamber and is used during the implantation of the next photoresist. The portion of the dopant that remains in the implantation chamber reduces the amount of time necessary to perform the implantation for the next substrate.

As used herein, a "mask" or "mask layer" recited in the present disclosure is an object of a patterning operation. The patterning operation includes various steps and operations and varies in accordance with features of embodiments. In some embodiments, a patterning operation patterns an existing film or layer. The patterning operation includes forming a mask on the existing film or layer and removing the unmasked portion of the film or layer with an etch or other removal operation. The mask layer is a photoresist or a hardmask. In some embodiments, a patterning operation directly forms a patterned layer on a surface. The patterning operation includes forming a photosensitive film on the surface, conducting a photolithography operation and a developing operation. The remaining photosensitive film may be removed or retained and integrated into the package.

As used herein, a "Front Opening Universal Pod (FOUP)" recited in the present disclosure is a specialized plastic enclosure designed to hold silicon wafers securely and safely in a controlled environment, and to allow the wafers to be removed for processing or measurement by tools equipped with appropriate load ports and robotic handling systems. Each FOUP has various coupling plates, pins, and holes to allow the FOUP to be located on a load port, and to be manipulated by the AMHS (Automated Material Handling System). FOUPs may also contain RF tags that allow them to be identified by readers on tools In some embodiments as in FIG. 1, a system 100 according to the present disclosure is provided. The system 100 includes a transfer chamber 110 surrounded by three processing chambers 120, 130 and 140. A factory interface 210 is coupled to the transfer chamber 110 by a load lock chamber 220. One or more FOUPs 230 are disposed in the factory interface 210 for storing substrate. A robot 150 is positioned in a central portion of the transfer chamber 110 to facilitate substrates to transfer among processing chambers 120, 130, 140 and the load lock chamber 220. These FOUPs 230 are used to provide substrates into or to remove substrates from the system 100. For instance, substrates are provided to the processing chambers 120, 130 and 140 from one FOUP 230 through the load lock chamber 220 and removed from the system 100 through the load lock chamber 220 to another FOUP 230.

Each of the processing chambers 120, 130, and 140 are configured to perform a different operation in processing of the substrate. In some embodiments, each of the processing chambers 120, 130 and 140 is separately installed in a different tool or system. In some embodiments, the processing chamber 120 is an implantation chamber for implanting dopants into a workpiece. In certain embodiments, the implantation chamber is a P3i® chamber, available from Applied Materials, Inc. of Santa Clara, Calif. However, other suitable implantation chambers, including those produced by other manufacturers, are utilized as well.

In some embodiments, the processing chamber 140 is an annealing chamber that is utilized to anneal the workpiece after implanting or stripping. In certain embodiments, the annealing chamber is a Radiance® rapid thermal processing chamber, available from Applied Materials, Inc. However, other suitable chambers, including those produced by other manufacturers are utilized as well.

In some embodiments, the processing chamber 130 is configured as a stripping chamber and is utilized to strip the photoresist having the crust thereon from the workpiece. In certain embodiments, the stripping chamber 131 described in FIG. 2 includes a chamber body 132, a chuck 133, a spray bar 134 and a mixer 151. The workpiece 135 or the semiconductor substrate is positioned on the chuck 133, which is accommodated in the chamber body 132. The mixer 151 is used to stir sulfuric mixtures and a steam to form a sulfuric mist 136. The spray bar 134 is designed to transfer the sulfuric mist 136 into the chamber body 132 and to distribute the sulfuric mist 136 around the workpiece 135. However, other suitable stripping chambers, including those produced by other manufacturers, are utilized as well. In certain embodiments, the spray bar 134 has several nozzles 240, which is used to spray the sulfuric mist 136 in a line from a center of the semiconductor substrate 11 to an edge of the semiconductor substrate 11.

Figure 3:
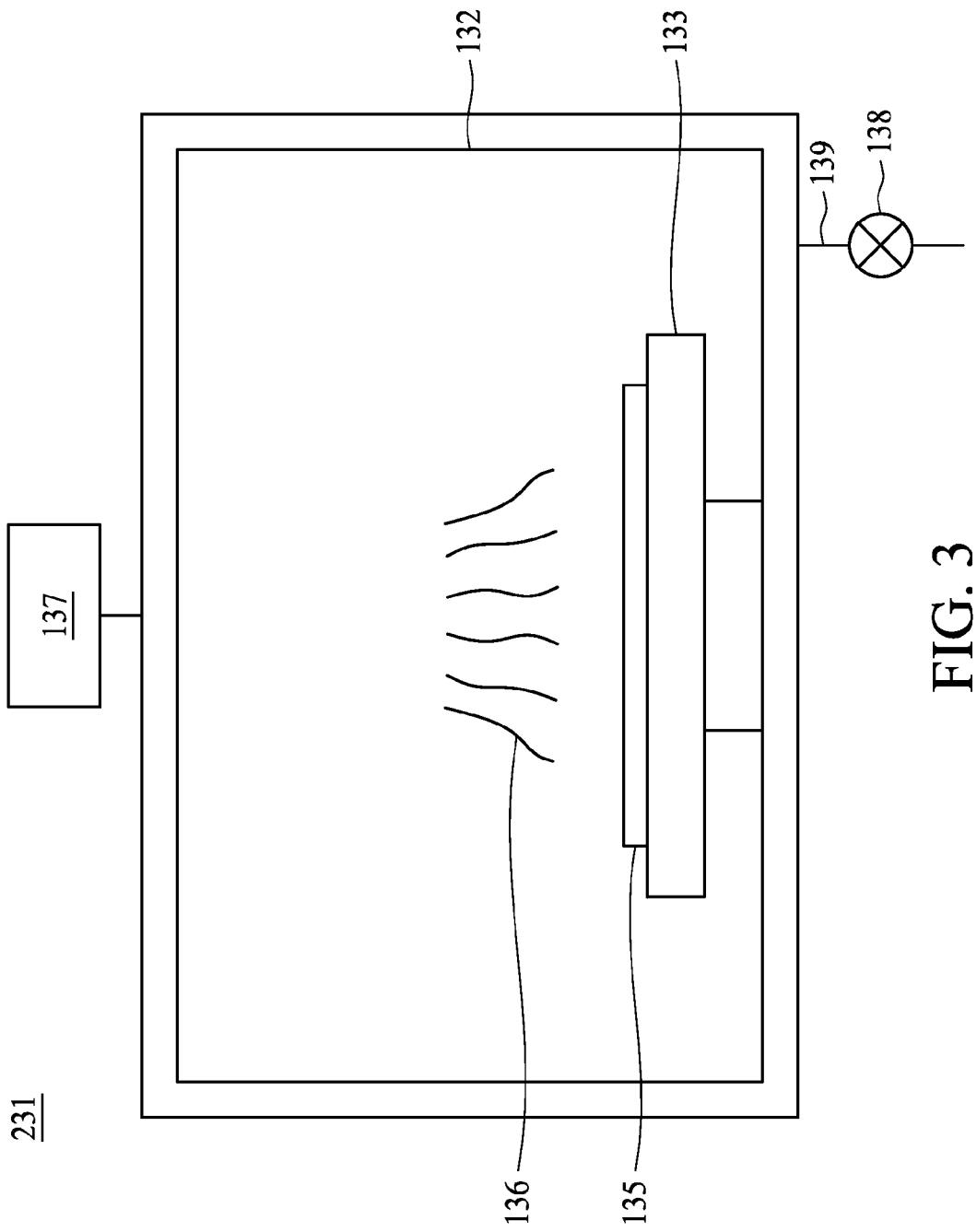
FIG. 3 is a cross-sectional view of a stripping chamber with a valve according to some embodiments of the present disclosure.

In still other embodiments, the stripping chamber 231 configured as in FIG. 3 includes a sulfuric mist source 137, a valve 138 and an exit port 139, as well as the chamber body 132 and the chuck 133 previously discussed with reference thereto and are not repeated here for simplicity. The sulfuric mist source 137 is designed to feed the sulfuric mist 136 into the stripping chamber 231. The valve 138 is used for the sulfuric mist 136 to exit the stripping chamber 231 through the exit port 139.

A method of fabricating a semiconductor device is used to strip or peel the photoresist having the crust layer thereon so as to prevent contaminants, due to the crust layer, from contaminating subsequent processes. The method includes a number of operations and the description and illustrations are not deemed as a limitation as the order of the operations.

A term "inserting" or "inserted" is used in the present disclosure to describe an operation of incorporating an impurity into an object. The inserting operation includes various steps and processes and varies in accordance with the features of embodiments. In certain embodiments, the inserting operation includes ion-implanting the dopants into the object. In some embodiments, the inserting operation includes pre-depositing the dopants into the object. For instance, the pre-deposition uses boron-based gas, such as $B_2H_6$ or $BCl_3$, within a temperature from about 1000° C. to about 1200° C., within about 200 sec to about 400 sec (about 50 CC to about 100 CC) for forming a p-well or a p-n junction string formation in an n-type semiconductor substrate. In some embodiments, the pre-deposition uses phosphorus-based gas, such as $PH_3$ or $POCl_3$, within a temperature from about 1000° C. to about 1200° C., within about 200 sec to about 400 sec (about 50 CC to about 100 CC) for forming an n-well or a p-n junction string formation in a p-type semiconductor substrate. In the present disclosure, a high and a low temperature are traded off for a short duration and a long duration for the operation, respectively.

A term "spraying" or "sprayed" is used in the present disclosure to describe an operation of putting a stream of very small drops of liquid on an object. The spraying operation includes various steps and processes and varies in accordance with the features of embodiments. In some embodiments, the spraying operation includes heating a stream of very small drops of liquid to a temperature range between about 80° C. and about 200° C.

A term "decorticating" or "decorticated" is used in the present disclosure to describe an operation of removing the outer coverings from an object. The decorticating operation includes various steps and processes and varies in accordance with the features of embodiments. In some embodiments, the decorticating operation includes enlarging or connecting the cracks in the photoresist.

Figure 4:
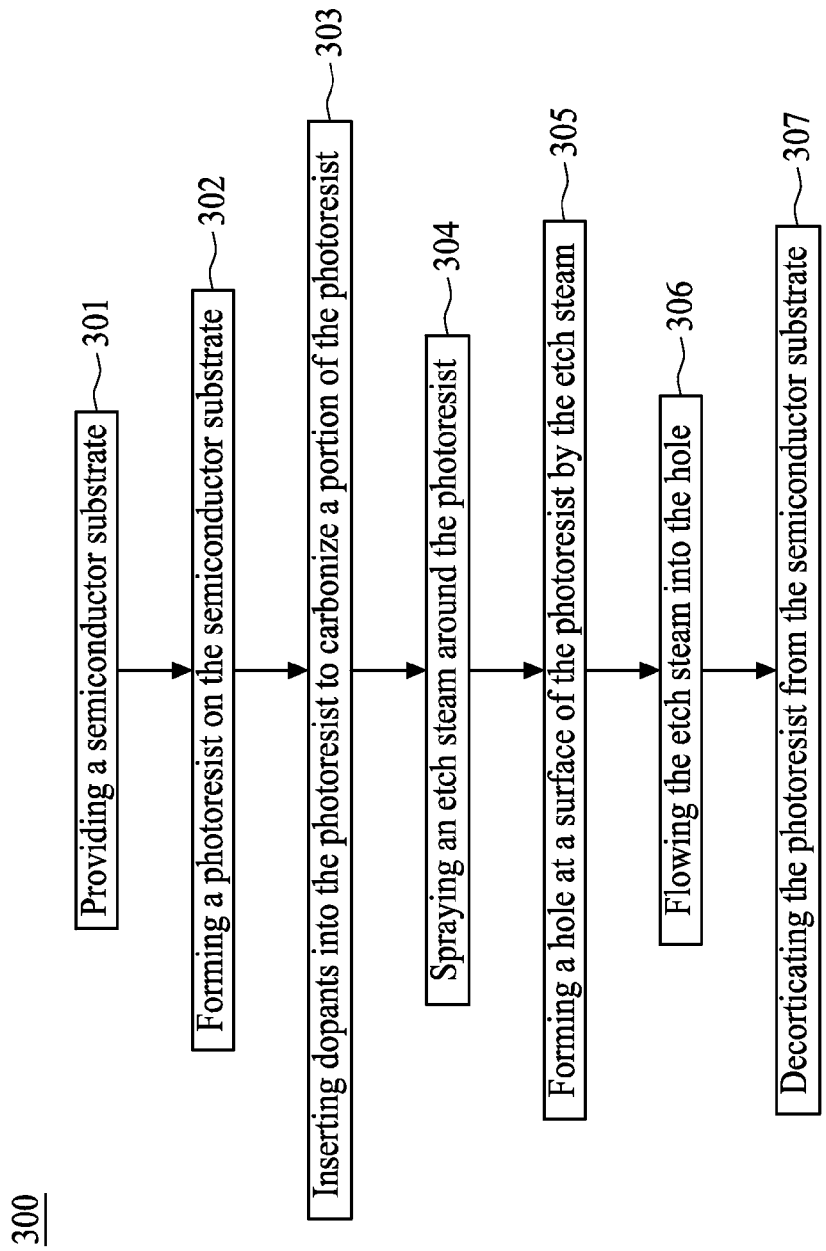
FIG. 4 is a flowchart of a method for decorticating the photoresist from the semiconductor substrate according to some embodiments of the present disclosure.

FIG. 4 is a diagram of a method 300 for decorticating a photoresist having a carbonized photoresist thereon from a semiconductor structure in accordance with some embodiments of the present disclosure. The method 300 includes several operations, which are discussed in detail with reference to FIGS. 5 to 9. At operation 301, a semiconductor substrate is provided. At operation 302, a photoresist is formed on the semiconductor substrate. At operation 303, dopants are inserted into the photoresist to carbonize a portion of the photoresist. At operation 304, an etch steam is sprayed around the photoresist. At operation 305, a hole is formed at a surface of the photoresist by the etch steam. At operation 306, the etch steam is flowed into the hole so as to remove a portion of the photoresist at an interface between the semiconductor substrate and the photoresist. At operation 307, the photoresist is decorticated from the semiconductor substrate.

Figure 2:
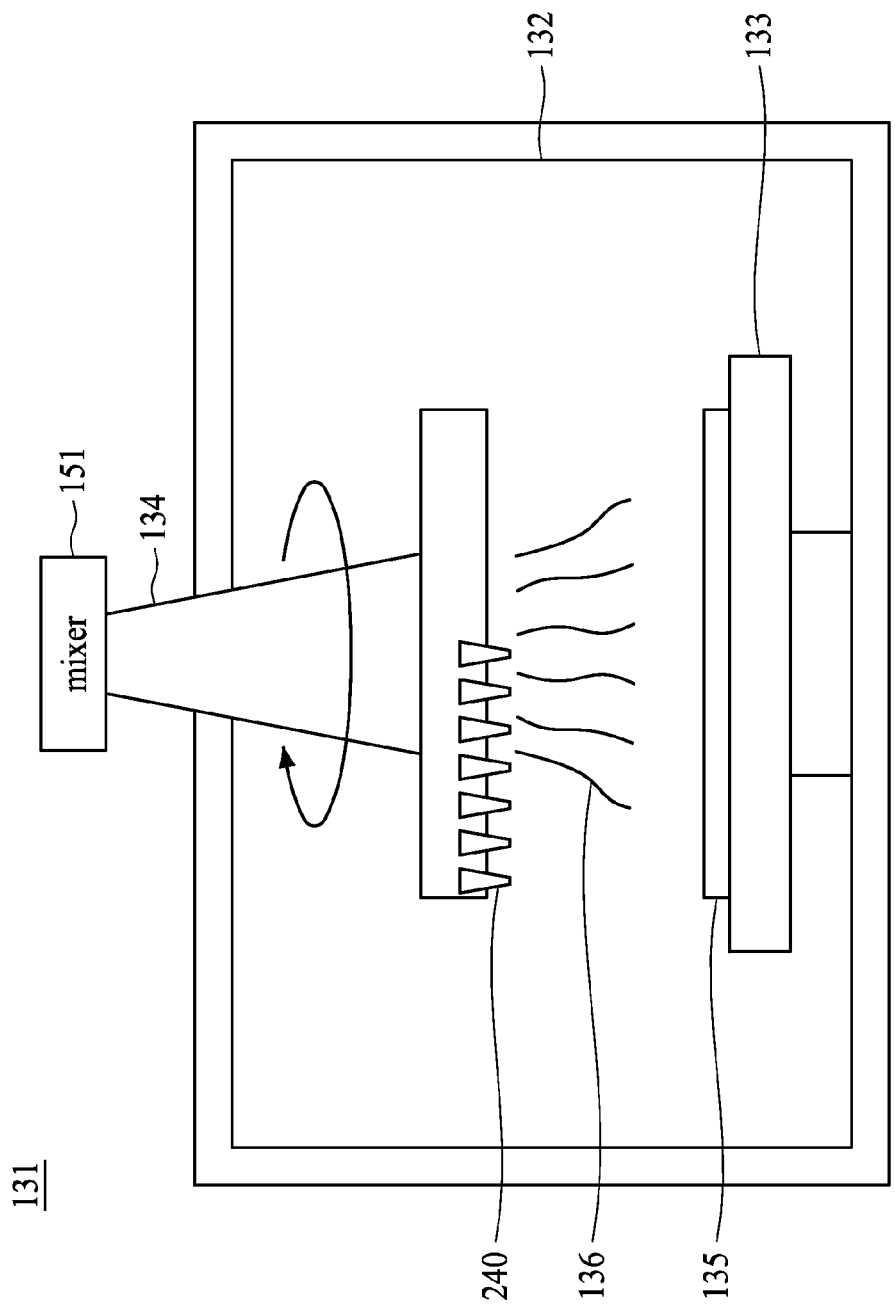
FIG. 2 is a cross-sectional view of a stripping chamber according to some embodiments of the present disclosure.

FIGS. 5 to 9 have been simplified for a better understanding of the inventive concepts of the present disclosure. In FIGS. 5 to 9, elements with same labeling numbers as those in FIGS. 1 to 3 are previously discussed with reference thereto and are not repeated here for simplicity.

Figure 5:
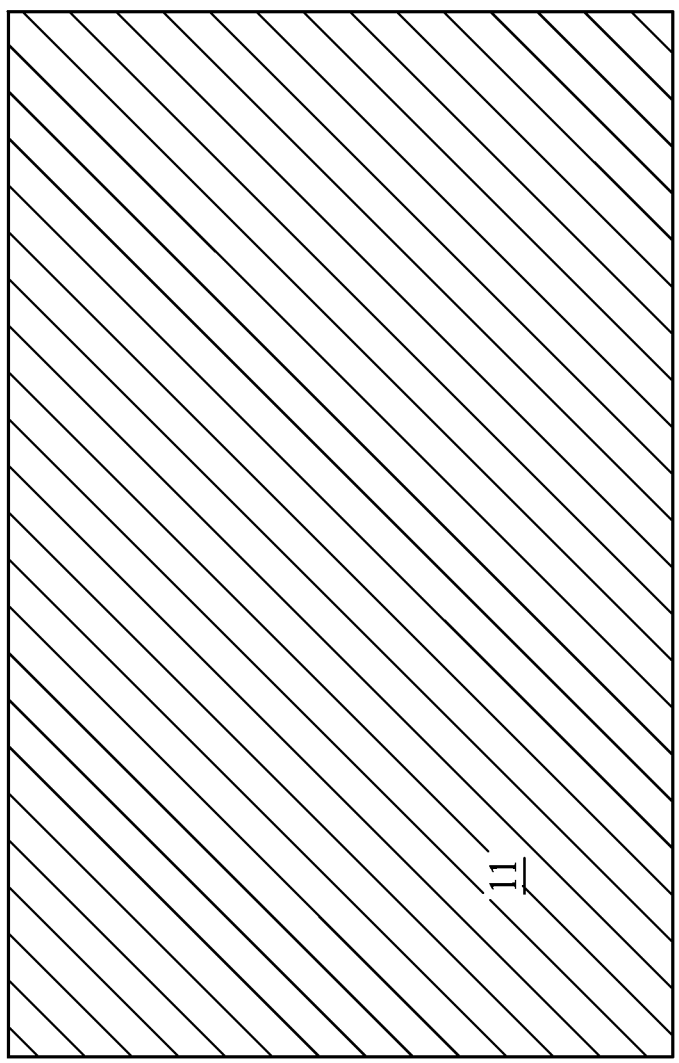
FIGS. 5 to 9 are cross-sectional views corresponding to various operations 301 to 307 in FIG. 4.

Referring to FIG. 5, a semiconductor substrate 11 is provided. In some embodiments, the semiconductor substrate 11 is a wafer including several dies, where each of which has active and passive devices using semiconductor manufacturing processes described above.

Figure 6:
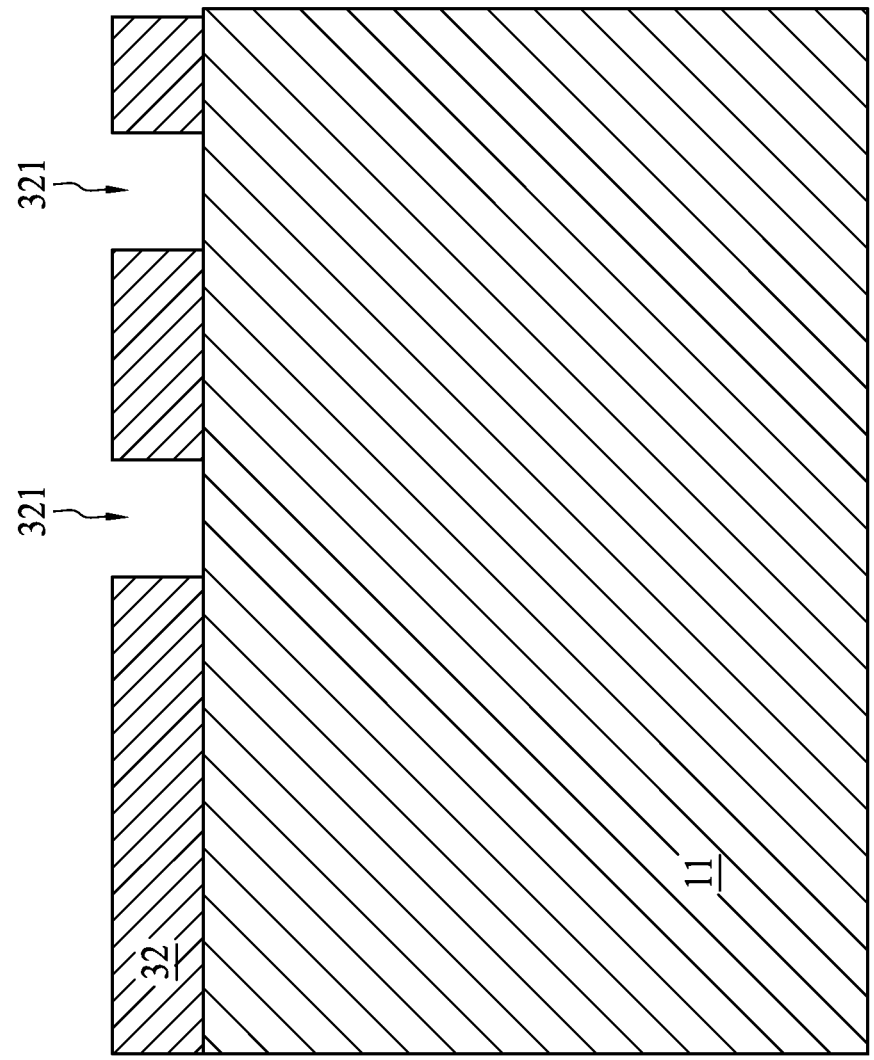

Referring to FIG. 6, the photoresist 32 is formed on the semiconductor substrate 11. In some embodiments as shown in FIG. 6, after the photoresist 32 is attached on the top surface of the semiconductor substrate 11, a portion of the photoresist 32 is removed by a developing process to form a gap 321 and further expose the top surface of the semiconductor substrate 11.

Figure 7:
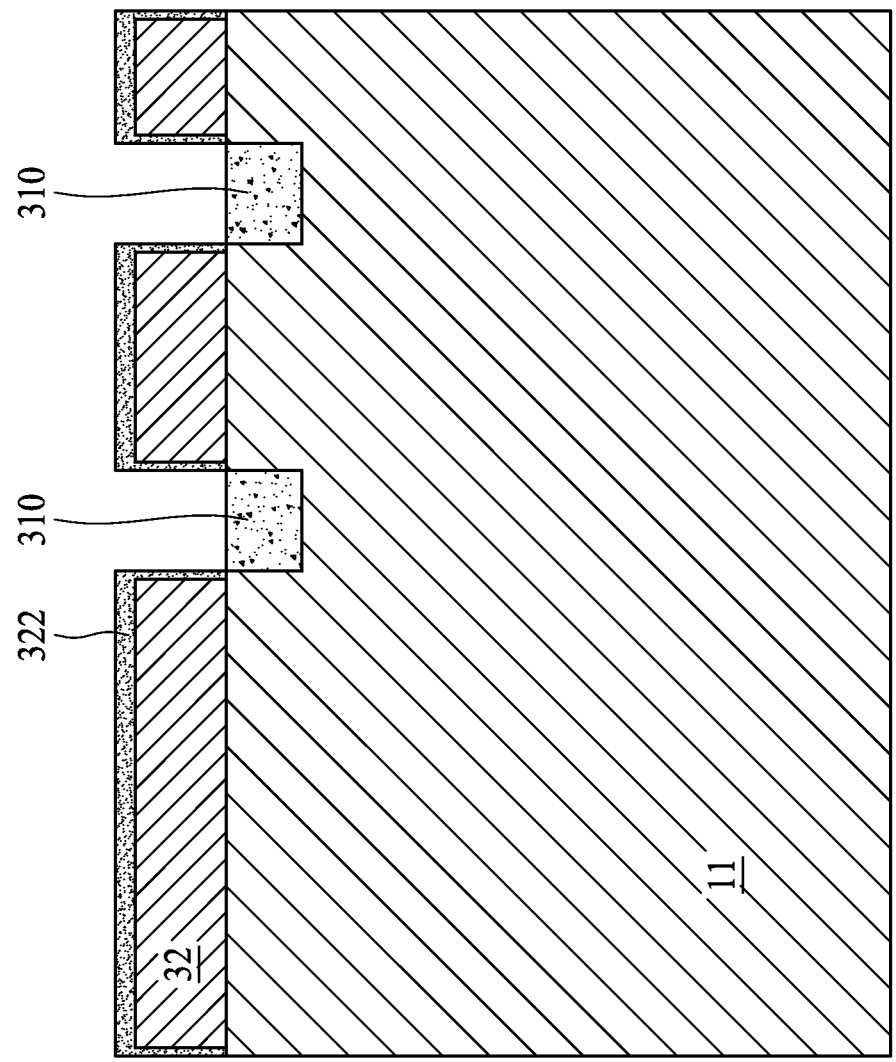

Referring to FIG. 7, during the implantation operation in the implantation chamber, dopants are inserted into the photoresist 32 to change chemical properties thereof. A high concentration of dopants promotes carbonization of a portion 322 of the photoresist 32. Since the implanting is beaming from top of the semiconductor substrate 11, the upper photoresist 32 is more likely carbonized than a lateral photoresist 32. That is, the concentration of dopants in the upper photoresist 32 is higher than those in the lateral photoresist 32. In some embodiments, the dopant concentration of the portion 322 is between about $1\times10^{13}$ and about $1\times10^{16}$. In certain embodiments, the concentration of dopants is between about $3\times10^{13}$ and about $8\times10^{16}$. In other embodiments, the concentration of dopants is between about $7\times10^{14}$ and about $6\times10^{17}$. In still some embodiments, the predetermined concentration is between about $9\times10^{12}$ and about $4\times10^{18}$.

In FIG. 7, dopants are inserted into the semiconductor substrate 11 to form the doped region 310, which is a p-well region, an n-well region, an LDD region, a source region, or a drain region according to the desired performance. Based on the desired electrical properties, the dopant is selected from group III elements (e.g., Gallium), group IV elements (e.g., Germanium), and group V elements (e.g., Arsenic).

Figure 8:
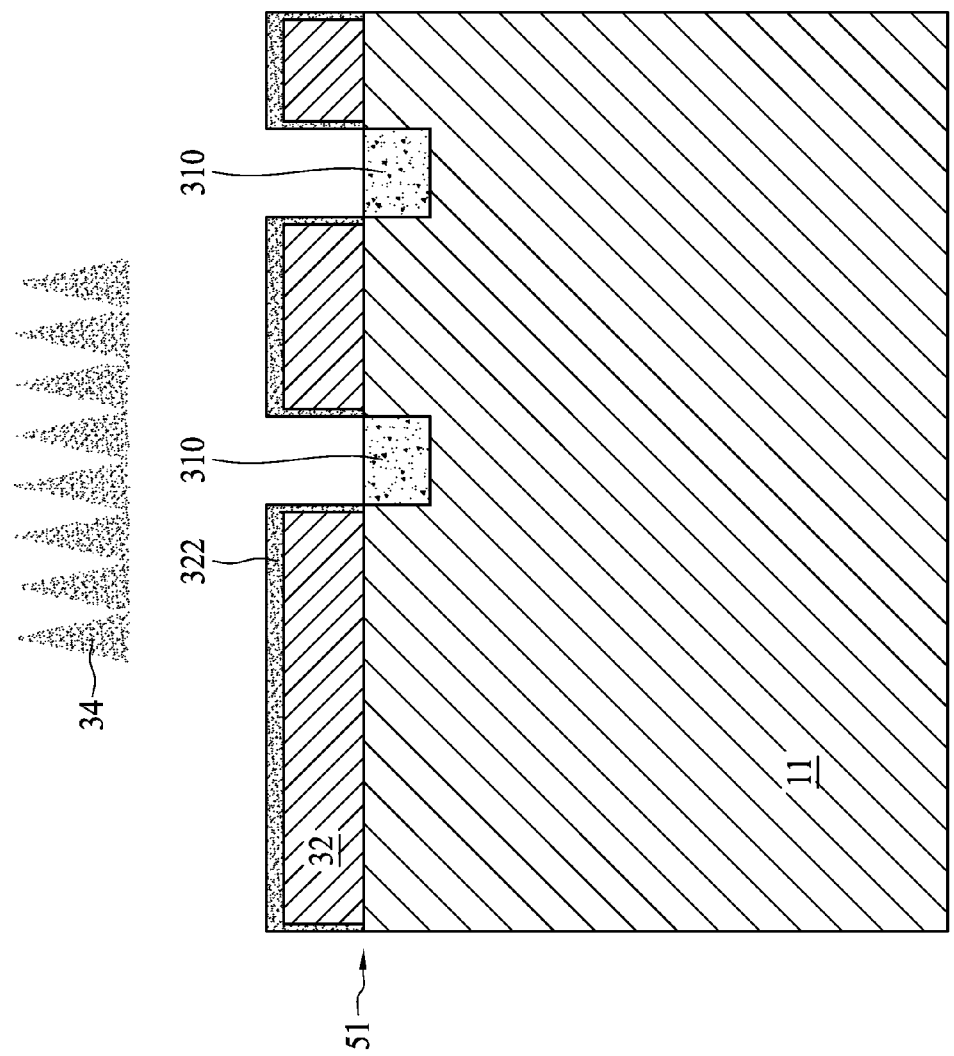

Referring to FIG. 8, the semiconductor substrate 11 having a crust-like photoresist 32 thereon is transferred from the implantation chamber to the stripping chamber. In a stripping operation, an etch steam 34 is sprayed into the stripping chamber so as to allow small drops of liquid of the etch steam 34 to float in the air around the photoresist 32. The temperature of the etch steam 34 is heated between about 150° C. and about 200° C. In some embodiments, the temperature of the etch steam 34 is between about 75° C. and about 185° C. In certain embodiments, the temperature of the etch steam 34 is between about 92° C. and about 225° C. In still some embodiments, the temperature of the etch steam 34 is between about 145° C. and about 175° C. In certain embodiments, a high and a low temperature are traded off for a short duration and a long duration for the operation, respectively.

In some embodiments, those small drops of liquid in the etch steam 34 are mixtures of sulfuric acid ($H_2SO_4$) and hydrogen peroxide ($H_2O_2$). The mixtures transiently form atomic oxygen, which attacks surface carbons of the photoresist and the stable carbonized crust to form carbon dioxide ($CO_2$) so as to dissolve the photoresist and the stable carbonized crust. In certain embodiments, the etch steam 34 is selected from peroxymonosulfuric acid ($H_2SO5$), peroxydisulfuric acid ($H_2S_2O_8$), a mixture of ozonated water, sulfur containing solutions, chlorine containing solutions, a base piranha (a mixture of ammonium hydroxide ($NH_4OH$) with hydrogen peroxide), a mixture of ammonium hydroxide, hydrogen peroxide and water ($H_2O$), a mixture of water and hydrogen fluoride (HF), a mixture of hydrogen fluoride, ammonium fluoride ($NH_4F$) and water, and a mixture of hydrogen chloride (HCl), water and hydrogen peroxide.

In some embodiments, the pressure in the stripping chamber affects the uniformity of those small drops of liquid in the etch steam 34. The desired pressure for uniformity is between about 14.7 psi and about 29.4 psi. In certain embodiments, the pressure is between about 11.3 psi and about 32.6 psi. In other embodiments, the pressure is between about 17.6 psi and about 42.7 psi. In still some embodiments, the pressure is between about 9.6 psi and about 38.7 psi.

In some embodiments, the speed of flowing the etch steam 34 into the stripping chamber affects the duration of the stripping operation. The desired speed is between about 0.02 $m^3 \cdot s^{-1}$ and about 1.25 $m^3 \cdot s^{-1}$. In certain embodiments, the speed is between about 0.05 $m^3 \cdot s^{-1}$ and about 2.61 $m^3 \cdot s^{-1}$. In other embodiments, the speed is between about 0.15 $m^3 \cdot s^{-1}$ and about 1.85 $m^3 \cdot s^{-1}$. In still some embodiments, the speed is between about 0.37 $m^3 \cdot s^{-1}$ and about 3.91 $m^3 \cdot s^{-1}$.

Figure 9:
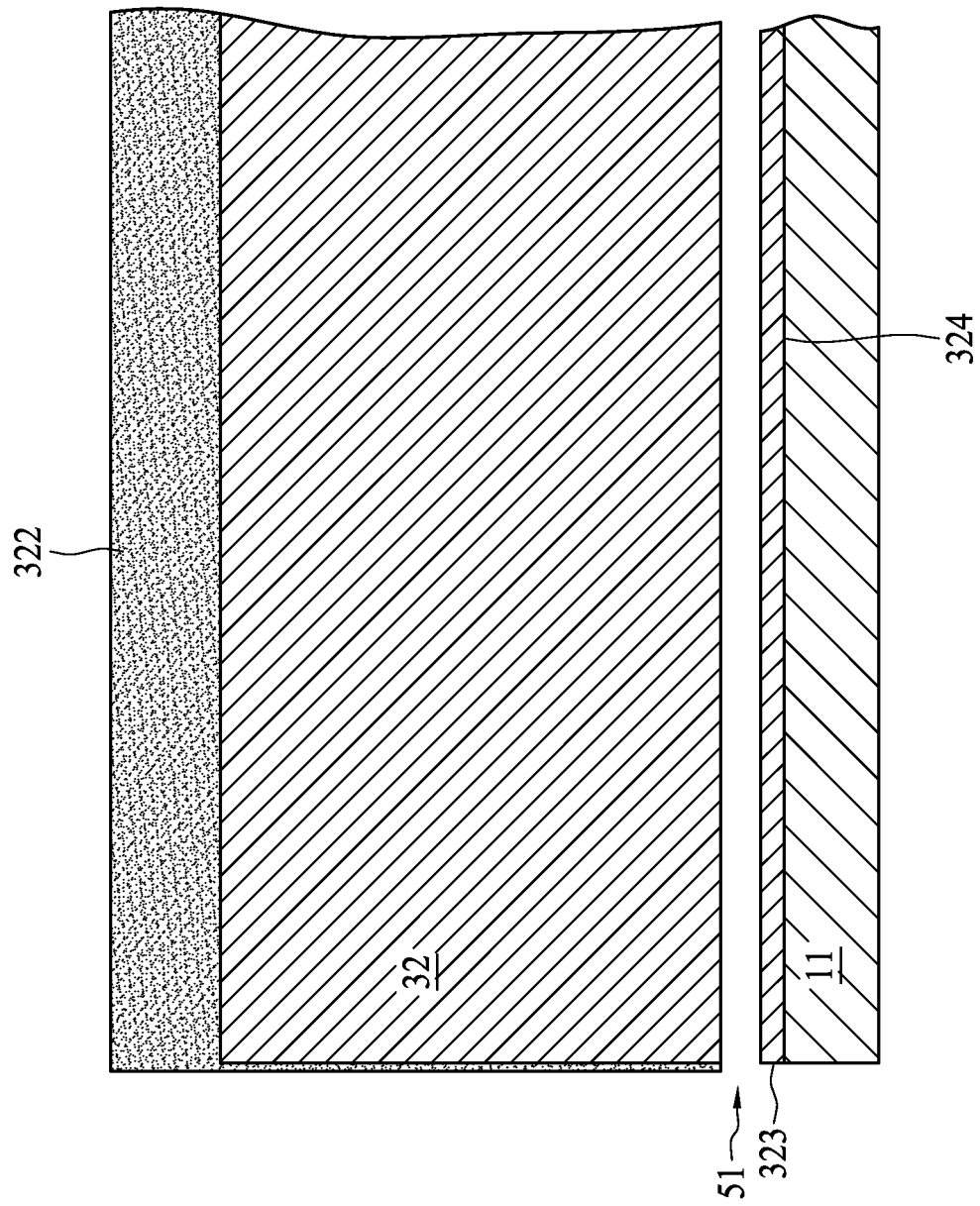

In the stripping operation as in FIG. 8, dissolving a part of the photoresist 32 by using the etch steam 34 leaves a hole 51 at a surface 323 of the photoresist 32 as shown in FIG. 9. FIG. 9 is an enlarged view of FIG. 8. In FIG. 9, the previously discussed pressure drives the etch steam 34 to flow into the hole 51 so as to further remove or dissolve a portion of the photoresist 32 so as to enlarge the hole 51. In some embodiments, the portion of the photoresist 32 is located near an interface 324 between the semiconductor substrate 11 and the photoresist 32. There are several holes 51 formed around the photoresist 32. As the etch steam 34 further invades the photoresist 32, the holes 51 enlarge and extend so as to connect with each other. When the different holes 51 are connected, the photoresist 32 is divided into two parts. The upper part having the crust layer is easily removed by the centrifugal force, while the bottom part without the crust layer is further dissolved by the etch steam 34. The photoresist 32 is efficiently decorticated from the semiconductor substrate 11 without a residual photoresist. Therefore, the present disclose provides a full-wet approach, which no plasma ash process is involved in and hence saves the costs of the ash process apparatus and the relevant consumables thereof is available.

FIG. 10 is a diagram of a method 400 for separating a photoresist having a carbonized photoresist thereon from a semiconductor structure in accordance with some embodiments of the present disclosure. The method 400 includes several operations, which are discussed in detail with reference to FIG. 11. At operation 401, a sulfuric mist is formed. At operation 402, the sulfuric mist is transferred into the spray bar. At operation 403, the sulfuric mist is distributed around the carbonized photoresist. At operation 404, a crack is formed at a surface of the photoresist by the sulfuric mist, wherein the crack is located near an interface between a semiconductor substrate and the photoresist. At operation 405, the photoresist is separated from the semiconductor substrate by the crack.

Figure 11:
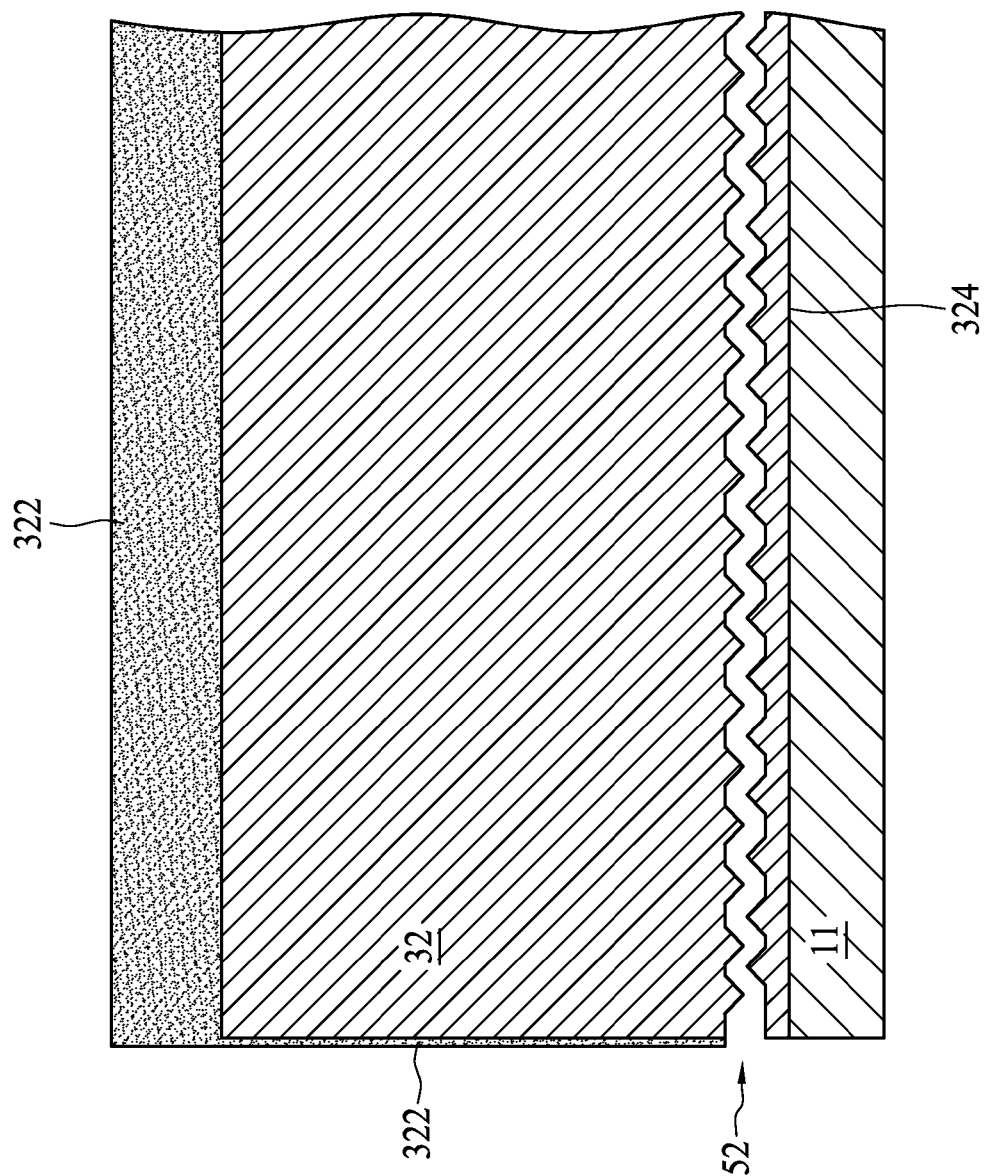
FIG. 11 is cross-sectional views corresponding to various operations 404 to 405 in FIG. 10.

FIG. 11 has been simplified for a better understanding of the inventive concepts of the present disclosure. In FIG. 11, elements with same labeling numbers as those in FIG. 2 are previously discussed with reference thereto and are not repeated here for simplicity.

Referring back to FIG. 2, during the stripping operation, the sulfuric mist 136 is formed in the mixer 51, which transfers the sulfuric mist 136 into the spray bar 134. The spray bar 134 sprays or distributes the sulfuric mist 136 above the workpiece 135, which may be a semiconductor substrate 11 with carbonized photoresist 32 formed thereon as previously discussed. The sulfuric mist 136 dissolves the photoresist 32 to form a crack 52 in the photoresist 32 shown in FIG. 11. Because the photoresist 32 is exposed under the sulfuric mist 136, several cracks on different sides are formed on the outer surface of the photoresist 32 by the sulfuric mist. In some embodiments of the stripping operation, the cracks 52 are located near the interface 324 between the semiconductor substrate 11 and the photoresist 32. When the cracks 52 extend into the bottom surface of the photoresist 32 and finally connect together, the photoresist 32 having the carbonized part thereon is separated from the semiconductor substrate 11. Consequently, the residue of photoresist 32 is quickly cleaned or dissolved by the sulfuric mist 136. Thus, there is no contaminant to the subsequent process that is sourced from the residual photoresist being generated atop the semiconductor substrate 11.

In some embodiments, since the spray bar 134 is adjustable to swiveling or spinning over the semiconductor substrate 11 and the semiconductor substrate 11 is spun on the chuck 133, the sulfuric mist 136 quickly dissolves the photoresist 32 to form a jagged crack 52 in FIG. 11. The swiveling frequency of the spray bar 134 is adjustable between about 150 rpm and about 1500 rpm. In some embodiments, the swiveling frequency is between about 195 rpm and about 2100 rpm. In certain embodiments, the swiveling frequency is between about 255 rpm and about 4500 rpm. In still some embodiments, the swiveling frequency is between about 450 rpm and about 6700 rpm.

In some embodiments, the temperature of the sulfuric mist 136 is heated between about 160° C. and about 205° C. In some embodiments, the temperature of the sulfuric mist 136 is between about 85° C. and about 195° C. In certain embodiments, the temperature of the sulfuric mist 136 is between about 112° C. and about 275° C. In still some embodiments, the temperature of the sulfuric mist 136 is between about 195° C. and about 325° C. In some embodiments, a high and a low temperature are traded off for a short duration and a long duration for the operation, respectively.

In some embodiments, the small drops of liquid in the sulfuric mist 136 are peroxymonosulfuric acid ($H_2SO_5$). The mixtures transiently form atomic oxygen, which attacks surface carbons of the photoresist and the stable carbonized crust to form carbon dioxide ($CO_2$) so as to dissolve the photoresist and the stable carbonized crust. In certain embodiments, the etch steam 34 is selected from peroxydisulfuric acid ($H_2S_2O_8$), a mixture of sulfuric acid ($H_2SO_4$) and hydrogen peroxide ($H_2O_2$), a mixture of ozonated water, sulfur containing solutions, chlorine containing solutions, a base piranha (a mixture of ammonium hydroxide ($NH_4OH$) with hydrogen peroxide), a mixture of ammonium hydroxide, hydrogen peroxide and water ($H_2O$), a mixture of water and hydrogen fluoride (HF), a mixture of hydrogen fluoride, ammonium fluoride ($NH_4F$) and water, and a mixture of hydrogen chloride (HCl), water and hydrogen peroxide.

In some embodiments, the pressure in the stripping chamber for the stripping operation affects the uniformity of those small drops of liquid in the sulfuric mist 136. The desired pressure for uniformity is between about 15.7 psi and about 28.4 psi. In certain embodiments, the pressure is between about 10.3 psi and about 33.6 psi. In other embodiments, the pressure is between about 18.6 psi and about 45.7 psi. In still some embodiments, the pressure is between about 7.6 psi and about 68.7 psi.

In some embodiments, the speed of flowing the sulfuric mist 136 into the stripping chamber affects the duration of the stripping operation. The desired speed is between about 0.01 $m^3 \cdot s^{-1}$ and about 1.85 $m^3 \cdot s^{-1}$. In certain embodiments, the speed is between about 0.07 $m^3 \cdot s^{-1}$ and about 3.61 $m^3 \cdot s^{-1}$. In other embodiments, the speed is between about 0.55 $m^3 \cdot s^{-1}$ and about 1.95 $m^3 \cdot s^{-1}$. In still some embodiments, the speed is between about 0.77 $m^3 \cdot s^{-1}$ and about 5.91 $m^3 \cdot s^{-1}$.

Figure 12:
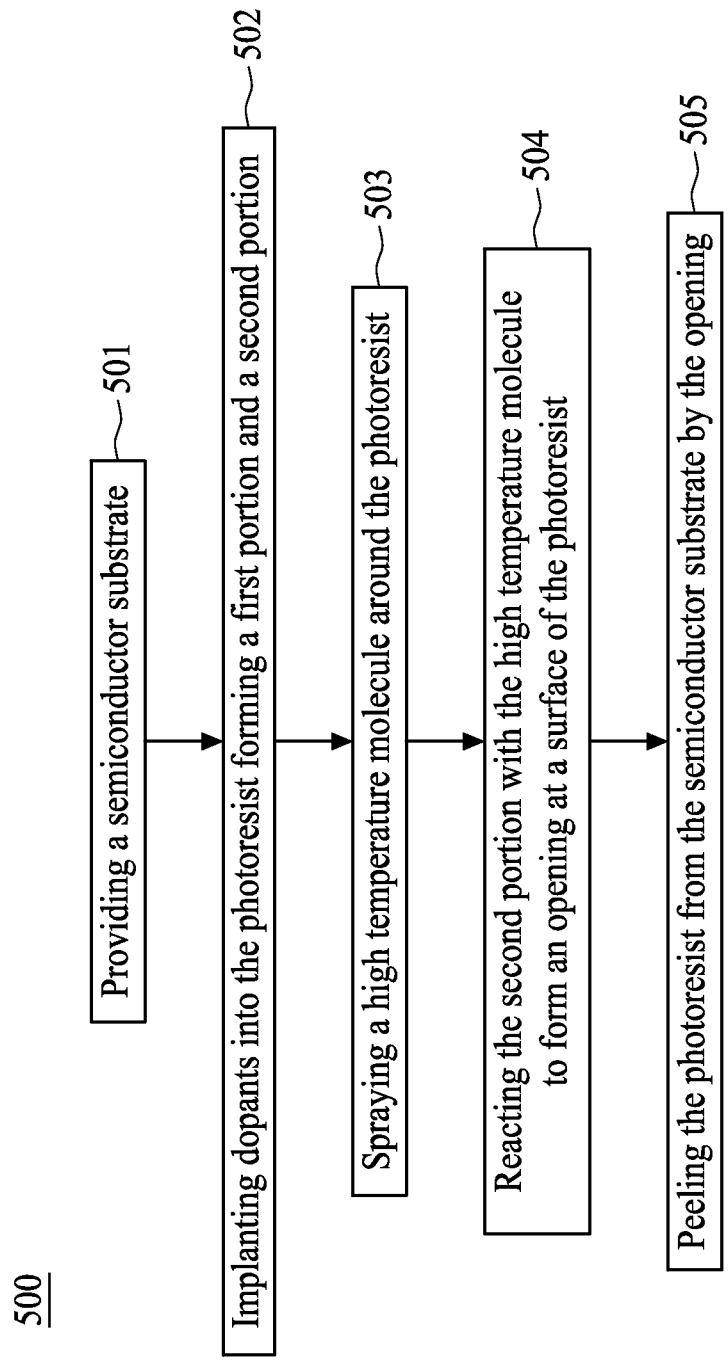
FIG. 12 is a flowchart of a method for peeling the photoresist from the semiconductor substrate according to some embodiments of the present disclosure.

FIG. 12 is a diagram of a method 500 for peeling a photoresist from a semiconductor structure in accordance with some embodiments of the present disclosure. The method 500 includes several operations, which are discussed in detail with reference to FIGS. 13 to 15. At operation 501, a semiconductor substrate having a photoresist thereon is provided. At operation 502, dopants are implanted into the photoresist that causes the photoresist to form a first portion and a second portion, wherein a dopant concentration of the first portion is greater than a dopant concentration of the second portion. At operation 503, a high temperature molecule is sprayed around the photoresist. At operation 504, the second portion is reacted with the high temperature molecule to form an opening at a surface of the photoresist, wherein the surface attaches to an interface between the semiconductor substrate and the photoresist. At operation 505, the photoresist is peeled from the semiconductor substrate by the opening.

Figure 13:
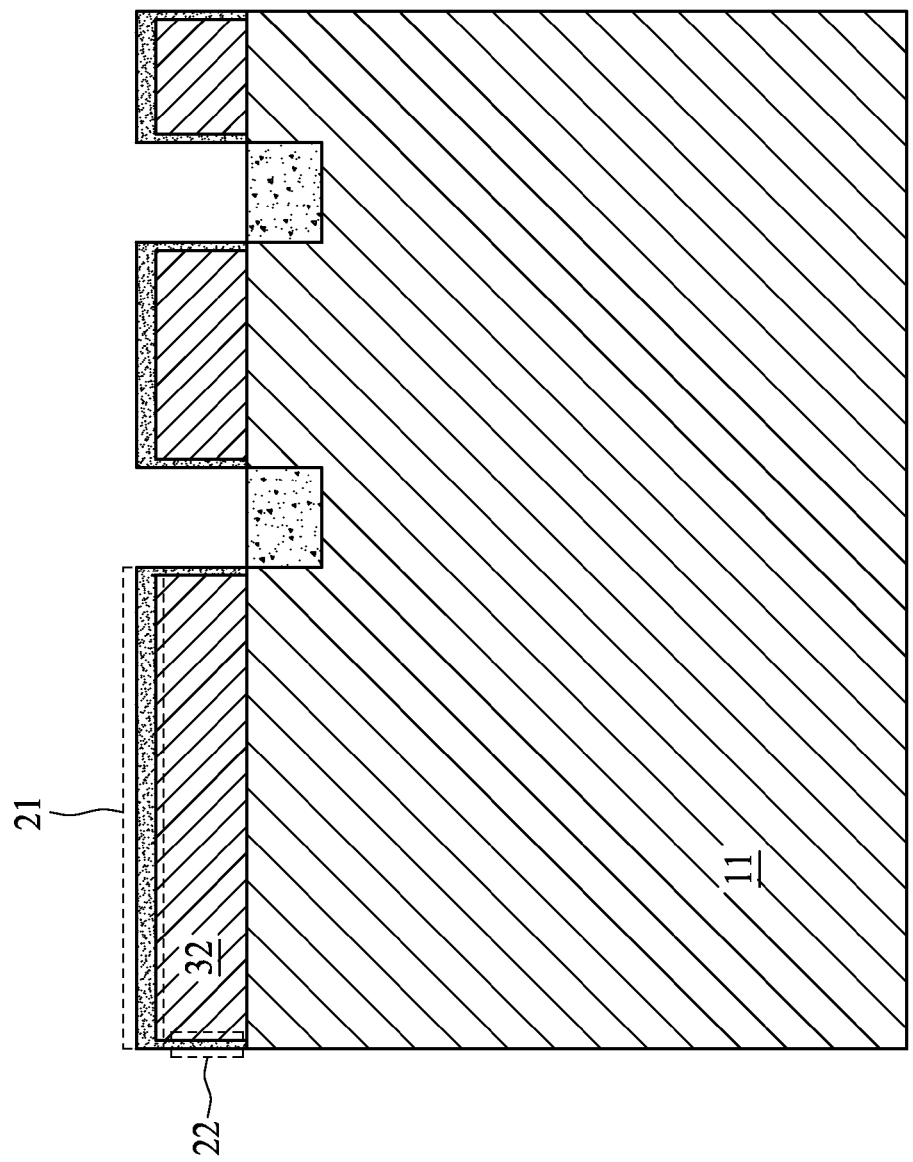
FIGS. 13 to 15 are cross-sectional views corresponding to various operations 502 to 505 in FIG. 12.
Figure 14:
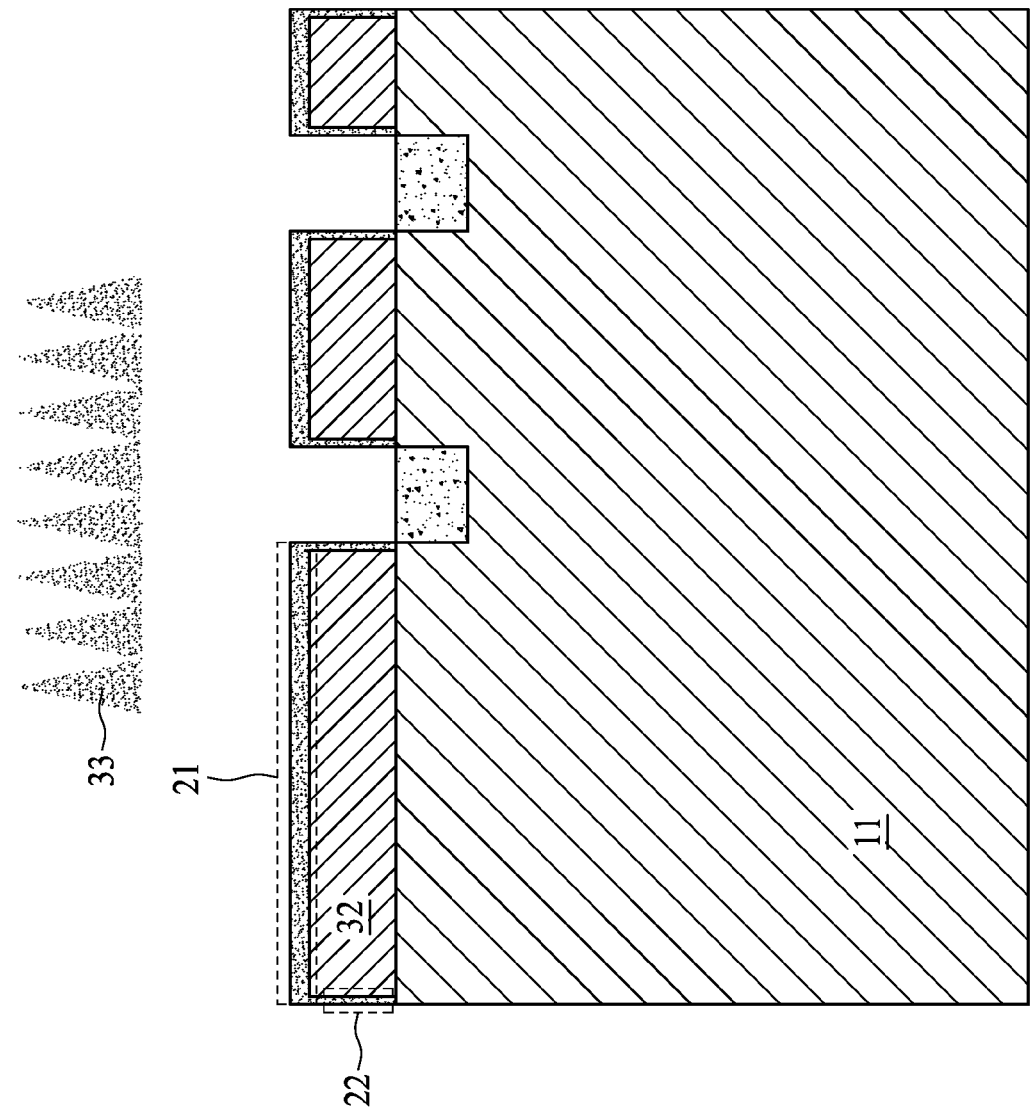
Figure 15:
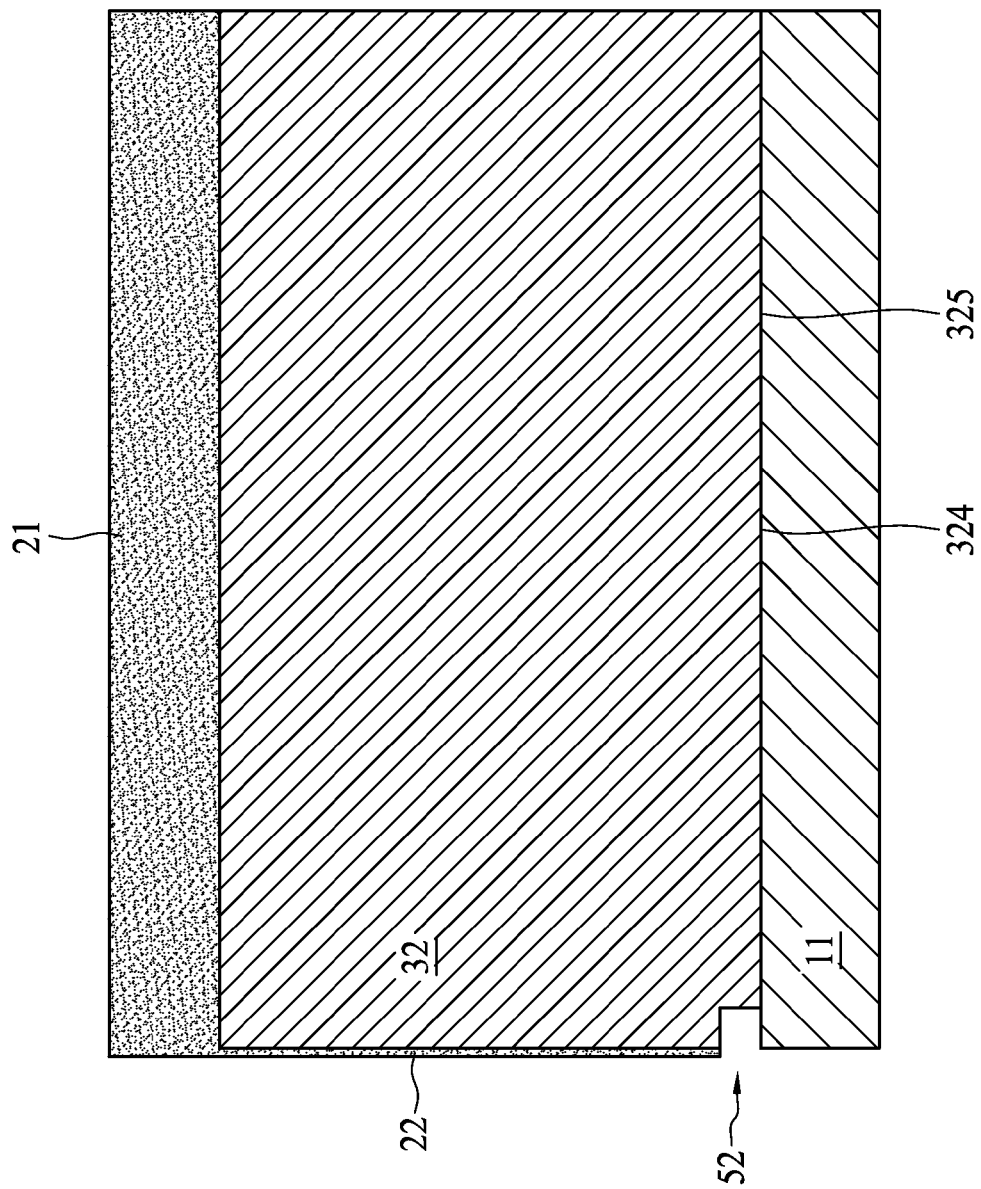

FIGS. 13 to 15 have been simplified for a better understanding of the inventive concepts of the present disclosure. In FIGS. 13 to 15, elements with the same labeling numbers as those in FIGS. 1 to 12 are previously discussed with reference thereto and are not repeated here for simplicity.

Referring to FIG. 13, during the implantation operation, dopants are inserted into the first portion 21 of the photoresist 32 and the second portion 22 of the photoresist 32. Since the implanting is beaming above the semiconductor substrate 11, the dopant concentration on the first portion 21 is greater than the concentration of the second portion 22. Therefore, the first portion 21 is heavily carbonized. In some embodiments, the dopant concentration of the first portion 21 is between about $1.5 \times 10^{13}$ and about $2.1 \times 10^{16}$. In certain embodiments, the dopant concentration of the first portion 21 is between about $3.5 \times 10^{13}$ and about $8.6 \times 10^{16}$. In other embodiments, the dopant concentration of the first portion 21 is between about $7.6 \times 10^{14}$ and about $6.9 \times 10^{17}$. In still some embodiments, the dopant concentration of the first portion 21 is between about $9.2 \times 10^{12}$ and about $4.8 \times 10^{18}$.

After the implantation operation, the semiconductor substrate 11 is transferred to perform the stripping operation in the stripping chamber. Referring to FIG. 14, a high temperature molecule 33 is sprayed in the form of small drops of liquid to float in the air around the photoresist 32. The temperature of the high temperature molecule 33 is adjusted between about 155° C. and about 235° C. In some embodiments, the temperature of the high temperature molecule 33 is between about 55° C. and about 285° C. In certain embodiments, the temperature of the high temperature molecule 33 is between about 132° C. and about 325° C. In still some embodiments, the temperature of the high temperature molecule 33 is between about 345° C. and about 575° C. In certain embodiments, a high and a low temperature are traded off for a short duration and a long duration for the operation, respectively.

In some embodiments, those small drops of liquid in the etch steam 34 are peroxydisulfuric acid ($H_2S_2O_8$). The mixtures transiently form atomic oxygen, which attacks surface carbons of the photoresist and the stable carbonized crust to form carbon dioxide ($CO_2$) so as to dissolve the photoresist and the stable carbonized crust. In certain embodiments, the etch steam 34 is selected from peroxymonosulfuric acid ($H_2SO5$), a mixture of sulfuric acid ($H_2SO_4$) and hydrogen peroxide ($H_2O_2$), a mixture of ozonated water, sulfur containing solutions, chlorine containing solutions, a base piranha (a mixture of ammonium hydroxide ($NH_4OH$) with hydrogen peroxide), a mixture of ammonium hydroxide, hydrogen peroxide and water ($H_2O$), a mixture of water and hydrogen fluoride (HF), a mixture of hydrogen fluoride, ammonium fluoride ($NH_4F$) and water, and a mixture of hydrogen chloride (HCl), water and hydrogen peroxide.

In some embodiments, the pressure in the stripping chamber affects the uniformity of the small drops of liquid in the high temperature molecule 33. The desired pressure for uniformity is between about 10.7 psi and about 20.4 psi. In certain embodiments, the pressure is between about 16.3 psi and about 62.6 psi. In other embodiments, the pressure is between about 37.6 psi and about 92.7 psi. In still some embodiments, the pressure is between about 59.6 psi and about 138.7 psi.

In some embodiments, the speed of flowing the high temperature molecule 33 into the stripping chamber affects the duration of the stripping operation. The desired speed is between about 0.09 $m^3 \cdot s^{-1}$ and about 2.35 $m^3 \cdot s^{-1}$. In certain embodiments, the speed is between about 0.18 $m^3 \cdot s^{-1}$ and about 4.67 $m^3 \cdot s^{-1}$. In other embodiments, the speed is between about 0.95 $m^3 \cdot s^{-1}$ and about 8.85 $m^3 \cdot s^{-1}$. In still some embodiments, the speed is between about 1.37 $m^3 \cdot s^{-1}$ and about 13.91 $m^3 \cdot s^{-1}$.

In the stripping operation as in FIG. 15, when the high temperature molecule 33 is reacted with a part of the second portion 22, the opening 53 is formed at the surface 325 of the photoresist 32. The surface 325 attaches to the interface 324 between the semiconductor substrate 11 and the photoresist 32. As the high temperature molecule 33 further invades the photoresist 32, the openings 53 enlarge and extend so as to connect with each other. After the openings 53 connect with each other, the photoresist 32 is completely peeled from the semiconductor substrate 11. Therefore, no residual photoresist 32 remains on the top surface of the semiconductor substrate 11.

In some embodiments, a method for decorticating a photoresist includes providing a semiconductor substrate. The method also includes forming a photoresist on the semiconductor substrate. The method also includes inserting dopants into the photoresist with a predetermined concentration to carbonize a portion of the photoresist. The method also includes spraying an etch steam around the photoresist. The method also includes forming a hole at a surface of the photoresist by the etch steam. The method also includes flowing the etch steam into the hole and further removing a portion of the photoresist near an interface between the semiconductor substrate and the photoresist. The method also includes decorticating the photoresist from the semiconductor substrate.

In some embodiments, a method for separating a photoresist includes forming a sulfuric mist. The method also includes transferring the sulfuric mist into the spray bar. The method also includes distributing the sulfuric mist around a carbonized photoresist. The method also includes forming a crack at a surface of the photoresist by the sulfuric mist, wherein the crack is located near an interface between a semiconductor substrate and the photoresist. The method also includes separating the photoresist from the semiconductor substrate by the crack.

In some embodiments, a method for peeling a photoresist includes providing a semiconductor substrate wherein a photoresist is formed above the semiconductor substrate. The method also includes implanting dopants into the photoresist forming a first portion and a second portion, wherein a dopant concentration of the first portion is greater than a dopant concentration of the second portion and the first portion is carbonized. The method also includes spraying a high temperature molecule around the photoresist. The method also includes reacting the second portion with the high temperature molecule to form an opening at a surface of the photoresist, wherein the surface attaches to an interface between the semiconductor substrate and the photoresist. The method also includes peeling the photoresist from the semiconductor substrate by the opening.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

As used in this application, "or" is intended to mean an inclusive "or" rather than an exclusive "or." In addition, "a" and "an" as used in this application are generally to be construed to mean "one or more" unless specified otherwise or clear from context to be directed to a singular form. Furthermore, to the extent that "includes", "having", "has", "with", or variants thereof are used in either the detailed description or the claims, such terms are intended to be inclusive in a manner similar to "comprising".

What is claimed is:

1. A method, comprising:
providing a semiconductor substrate;
forming a photoresist on the semiconductor substrate;
inserting dopants into the photoresist with a predetermined concentration to carbonize the photoresist to make a dopant concentration of a first portion of the photoresist is greater than a dopant concentration of a second portion of the photoresist;
spraying an etch steam around the photoresist;
forming a hole at a surface of the second portion of the photoresist by the etch steam;
flowing the etch steam into the hole and further removing a portion of the photoresist near an interface between the semiconductor substrate and the photoresist; and
decorticating the photoresist from the semiconductor substrate.

2. The method of claim 1, wherein the semiconductor substrate includes a doped region selected from a p-well region, an n-well region, a source region, and a drain region.

3. The method of claim 1, wherein a temperature range of the etch steam is between about 150° C. and 200° C.

4. The method of claim 1, wherein the etch steam includes a mixture of sulfuric acid ($H_2SO_4$) and hydrogen peroxide ($H_2O_2$).

5. The method of claim 1, wherein the predetermined concentration is between about $1\times10^{13}$ and about $1\times10^{16}$.

6. The method of claim 1, wherein spraying the etch steam to surround the photoresist is under a pressure between about 9.6 psi and about 42.7 psi.

7. The method of claim 1, wherein spraying the etch steam to surround the photoresist is at a flowing speed between about 0.02 $m^3 \cdot s^{-1}$ and about 3.91 $m^3 \cdot s^{-1}$.

8. A method, comprising:
forming a sulfuric mist;
transferring the sulfuric mist into a spray bar;
distributing the sulfuric mist around a carbonized photoresist, wherein the carbonized photoresist comprises a first portion and a second portion, and a dopant concentration of the first portion is greater than a dopant concentration of the second portion;
forming a crack at a surface of the second portion of the photoresist by the sulfuric mist, wherein the crack is located near an interface between a semiconductor substrate and the photoresist; and
separating the photoresist from the semiconductor substrate by the crack.

9. The method of claim 8, wherein the sulfuric mist has a temperature between about 150° C. and 200° C.

10. The method of claim 8, wherein the spray bar has a plurality of nozzles, and the nozzles spray the sulfuric mist in a line from a center of the semiconductor substrate to an edge of the semiconductor substrate.

11. The method of claim 8, further comprising spinning the semiconductor substrate to allow the sulfuric mist to cover the photoresist.

12. The method of claim 8, further comprising swiveling the spray bar over the semiconductor substrate.

13. The method of claim 12, wherein the swiveling frequency is between about 150 rpm and about 6700 rpm.

14. The method of claim 8, wherein distributing the sulfuric mist to surround the photoresist is under a pressure between about 7.6 psi and about 68.7 psi.

15. The method of claim 8, wherein distributing the sulfuric mist to surround the photoresist is at a flowing speed between about 0.01 $m^3 \cdot s^{-1}$ and about 5.91 $m^3 \cdot s^{-1}$.

16. A method, comprising:
providing a semiconductor substrate wherein a photoresist is formed above the semiconductor substrate;
implanting dopants into the photoresist forming a first portion and a second portion, wherein a dopant concentration of the first portion is greater than a dopant concentration of the second portion and the first portion is carbonized;
spraying a high temperature molecule around the photoresist;
reacting the second portion with a high temperature molecule to form an opening at a surface of the second portion of the photoresist, wherein the surface attaches to an interface between the semiconductor substrate and the photoresist; and
peeling the photoresist from the semiconductor substrate by the opening.

17. The method of claim 16, wherein the dopant concentration of the first portion is between about $1 \times 10^{13}$ and about $1 \times 10^{16}$.

18. The method of claim 16, wherein spraying a high temperature molecule to surround the photoresist is under a pressure between about 10.7 psi and about 138.7 psi.

19. The method of claim 16, wherein the high temperature molecule includes a peroxymonosulfuric acid ($H_2SO_5$).

20. The method of claim 16, wherein spraying a high temperature molecule to surround the photoresist is at an injection speed between about 0.09 $m^3 \cdot s^{-1}$ and about 13.91 $m^3 \cdot s^{-1}$.

* * * * *